(12) United States Patent
Tanabe et al.

(10) Patent No.: US 8,485,310 B2
(45) Date of Patent: Jul. 16, 2013

(54) SILENCING EQUIPMENT FOR ELECTRIC DEVICES

(75) Inventors: Yosuke Tanabe, Hitachinaka (JP); Masanori Watanabe, Hitachinaka (JP); Akira Goto, Isehara (JP); Shigeyasu Tsubaki, Odawara (JP); Masahiko Usui, Kawasaki (JP); Akio Idei, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/044,133

(22) Filed: Mar. 9, 2011

(65) Prior Publication Data

US 2011/0155504 A1    Jun. 30, 2011

Related U.S. Application Data

(62) Division of application No. 12/536,598, filed on Aug. 6, 2009, now abandoned.

(30) Foreign Application Priority Data

Sep. 30, 2008  (JP) ................................. 2008-253674

(51) Int. Cl.
*F01N 1/04* (2006.01)
*F24F 13/24* (2006.01)
*F01N 1/00* (2006.01)
*F24F 13/00* (2006.01)

(52) U.S. Cl.
USPC ........... 181/225; 181/224; 181/250; 454/262; 454/346; 454/347; 361/679.49

(58) Field of Classification Search
USPC ................. 181/225, 224, 250, 226, 293, 284, 181/254; 454/262, 906, 206, 346, 347, 348, 454/351, 352; 361/695, 692, 694, 679.48, 361/679.49, 678, 690
See application file for complete search history.

(56) References Cited

U.S. PATENT DOCUMENTS

| | | | |
|---|---|---|---|
| 1,554,180 | A | 9/1925 | Trader |
| 1,705,778 | A | 3/1929 | Munroe et al. |
| 1,825,770 | A | 10/1931 | Barnett |
| 2,916,101 | A | 12/1959 | Naman |

(Continued)

FOREIGN PATENT DOCUMENTS

| | | |
|---|---|---|
| JP | 63120809 A | 5/1988 |
| JP | 01-169194 | 7/1989 |

(Continued)

*Primary Examiner* — Edgardo San Martin
(74) *Attorney, Agent, or Firm* — Foley & Lardner LLP

(57) ABSTRACT

Silencing equipment provided with one or more flow channels through which cooling air flows has a flow channel forming member that forms the flow channel, and an acoustic absorbent member that is fixed to the flow channel forming member. A resonance type silencer is formed on a wall surface of the flow channel by providing a cavity for the resonance type silencer in the acoustic absorbent member and an aperture for the resonance type silencer in a portion of the flow channel forming member. The resonance type silencer sets a frequency of noise necessary to be reduced based on a peak frequency of noise generated by a fan. The silencing equipment further has a slide member which slides by a slide mechanism to adjust the area of the top of the aperture. The silencing equipment for electronic devices capable of cooling heat generating sections thereof with air has a small and simple structure and can improve a silencing effect by blowing air.

3 Claims, 15 Drawing Sheets

U.S. PATENT DOCUMENTS

| | | | |
|---|---|---|---|
| 2,989,136 | A | 6/1961 | Wohlberg |
| 3,159,236 | A | 12/1964 | Akerson |
| 3,470,978 | A | 10/1969 | Wagtskjold et al. |
| 4,260,037 | A | 4/1981 | Eline |
| 4,330,047 | A | 5/1982 | Ruspa et al. |
| 4,508,486 | A | 4/1985 | Tinker |
| 4,645,032 | A | 2/1987 | Ross et al. |
| 5,377,629 | A * | 1/1995 | Brackett et al. .......... 123/184.56 |
| 5,457,291 | A | 10/1995 | Richardson |
| 5,930,371 | A * | 7/1999 | Cheng et al. ................. 381/71.5 |
| 6,033,756 | A | 3/2000 | Handscomb |
| 6,104,608 | A | 8/2000 | Casinelli et al. |
| 6,390,770 | B1 * | 5/2002 | Takeshita ..................... 415/119 |
| 6,589,112 | B2 | 7/2003 | Ruach |
| 6,896,095 | B2 * | 5/2005 | Shah et al. ................... 181/198 |
| 7,334,662 | B1 | 2/2008 | Anderl et al. |
| 7,353,908 | B1 | 4/2008 | French |
| 7,357,220 | B2 * | 4/2008 | Horikou ....................... 181/250 |
| 7,546,898 | B2 | 6/2009 | Tracy et al. |
| 7,646,603 | B2 | 1/2010 | Bard et al. |
| 7,690,478 | B2 * | 4/2010 | Kostun et al. ................. 181/250 |
| 2001/0014163 | A1 | 8/2001 | Hickman et al. |
| 2005/0161280 | A1 | 7/2005 | Furuya |
| 2007/0292261 | A1 | 12/2007 | Tang et al. |

FOREIGN PATENT DOCUMENTS

| | | |
|---|---|---|
| JP | 04-99893 | 8/1992 |
| JP | 2005-226864 A | 9/1993 |
| JP | 10-008940 | 1/1998 |
| JP | 11-259076 | 9/1999 |
| JP | 2007-192262 | 8/2007 |
| JP | 2008-235381 A | 10/2008 |

* cited by examiner

SILENCING EQUIPMENT FOR ELECTRIC DEVICES

CROSS REFERENCE TO RELATED PATENT APPLICATIONS

Japan Priority Application 2008-253674 filed Sep. 30, 2008 including the specification, drawings, claims and abstract, is incorporated herein by reference in its entirety. This application is a Divisional of U.S. application Ser. No. 12/536,598 filed Aug. 6, 2009, incorporated herein by reference in its entirety.

BACKGROUND OF THE INVENTION

The present invention relates to silencing equipment for electronic devices, and more particularly to silencing equipment for electronic devices, the equipment having a simple structure and being adapted to be installed to an electronic device capable of cooling a heat generating section thereof with air, in order to reduce the level of noise generated by a fan.

In recent years, electronic devices called blade servers have rapidly spread. A blade server includes multiple servers that are installed in a chassis and attachable to or removable from the chassis. Utilizing the blade server has significantly increased the server installation density in the chassis. With the increase in the server installation density, the number of fans that cool heat generating sections (CPU, memory, hard disk and the like) provided in the servers and the rotation speed of the fans have been increased. As a result, the level of noise generated by the electronic device has increased.

The chassis can be downsized due to the increase in the server installation density. Thus, a case in which a blade server is installed in an office has been increased. This makes a request strong for reducing the level of noise generated by a blade server. To satisfy such a request for reducing the level of noise, silencing equipment including an acoustic absorbent member made of glass wool or urethane is installed in the vicinity of a fan or in a chassis in many cases. Such silencing equipment provides a silencing effect on a frequency band on the basis of acoustic absorption characteristics of the acoustic absorbent member.

The following describes conventional silencing equipment for electronic devices with reference to FIG. 16.

FIG. 16 is a cross sectional view of the conventional silencing equipment for electronic devices.

JP-A-H05-226864 discloses a conventional silencing structure for an electronic device, the structure being the same as that of the equipment described above.

A typical electronic device such as a blade server includes a chassis 13, a fan 15 and a plurality of servers 16 having heat generating sections such as CPUs. Cooling air enters the electronic device through an intake port 14 and flows out of the electronic device through an exhaust port 20. A silencing structure 17 includes a plurality of acoustic absorbent members 18, 19, 21 and 22 which are located in the vicinity of the fan 15 or in the vicinity of the intake or exhaust port in order to reduce the level of noise generated by the fan 15.

A problem with the conventional silencing equipment for electronic devices is described below with reference to FIGS. 16 to 18.

FIG. 17 is a graph showing the relationship between a frequency of noise generated by the fan and the noise level.

FIG. 18 is a graph showing the relationship between a frequency of noise to be absorbed by a general acoustic absorbent material and a sound absorption rate.

The plurality of acoustic absorbent members 18, 19, 21 and 22 form the silencing structure 17 of the conventional silencing equipment for electronic devices as shown in FIG. 16, to reduce the level of noise generated by the fan 15. The noise generated by the fan 15 has a specified peak frequency that is relatively low in many cases. As shown in FIG. 18, however, a general acoustic absorbent member made of glass wool or urethane absorbs more noise with a high frequency compared with noise with a low frequency. It is, therefore, necessary that the acoustic absorbent members 18, 19, 21 and 22 have large thicknesses and large areas in order to significantly reduce the level of noise generated by the fan 15 shown in FIG. 16. There has been a problem that the size of the silencing structure 17 increases. In addition, as fluid resistance increases due to the increase in the size of the silencing structure, cooling air is prevented from passing through the silencing equipment. Furthermore, as the number of servers attachable to or removable from the electronic device such as a blade server changes, the amount of heat generated by the electronic device changes. Thus, it is necessary to change specifications of the electronic device, such as the rotation speed of the fan 15. As a result, frequency characteristics of the noise change. In this case, it is necessary to reconfigure the silencing structure 17 based on an allowable value of noise at the location at which the electronic device is installed.

The present invention is devised to solve the aforementioned problems. It is, therefore, an object of the present invention to provide silencing equipment for electronic devices that cool heat generating sections thereof with air, the silencing equipment having a small and simple structure and providing a large silencing effect to reduce the level of noise generated by a fan.

SUMMARY OF THE INVENTION

According to an aspect of the present invention, silencing equipment for electronic devices to reduce a peak frequency of noise generated by a fan has a resonance type silencer(s) and is adapted to be installed in or outside a chassis of an electron device such as a blade server in which cooling air by means of the fan blows to cool heat generating sections thereof.

The resonance type silencer(s) is provided in a flow channel(s) through which cooling air to flows. The silencing equipment has a flow channel forming member and an acoustic absorbent member. The flow channel forming member forms the flow channel through which cooling air flows. The acoustic absorbent member is fixed to the flow channel forming member. The resonance type silencer includes a cavity in the acoustic absorbent member and an aperture provided in a portion of the flow channel forming member. The resonance type silencer is formed on a wall surface of the flow channel.

According to another aspect of the present invention, silencing equipment for electronic devices has a resonance type silencer(s) and is adapted to be installed in or outside a chassis of an electron device to reduce noise even when frequency characteristics of noise generated by the fan change due to a change in specifications of the electronic device or a change in an operating condition of the electronic device. The silencing equipment is capable of changing a target frequency of the resonance type silencer.

The resonance type silencer(s) is provided in a flow channel (s) adapted to cause cooling air to flow. The silencing equipment has a flow channel forming member and an acoustic absorbent member. The flow channel forming member forms the channel adapted to cause cooling air to flow. The acoustic absorbent member is fixed to the flow channel forming member. The resonance type silencer includes a cavity in the acoustic absorbent member and an aperture provided in a portion of the flow channel forming member. The resonance type silencer is formed on a wall surface of the flow channel. The silencing equipment has a slide member which slides by a slide mechanism to adjust the area of the top of the aperture of the resonance type silencer.

According to still another aspect of the present invention, silencing equipment for electronic devices has an expansion type silencer in or outside a chassis of an electronic device such as a blade server that causes cooling air to flow by means of a fan to cool a heat generating section thereof. The expansion type silencer is formed on a wall surface of the flow channel and capable of reducing a peak frequency of noise generated by the fan.

According to the present invention, the silencing equipment for electronic devices that cool heat generating section thereof with air has a small and simple structure and provides a large silencing effect to reduce the level of noise generated by the fan.

DESCRIPTION OF THE PREFERRED EMBODIMENTS

Embodiments of the present invention are described below with reference to FIGS. 1 to 20.

First Embodiment

The first embodiment of the present invention is described below with reference to FIGS. 1 to 3, 19 and 20.

Figure 1:
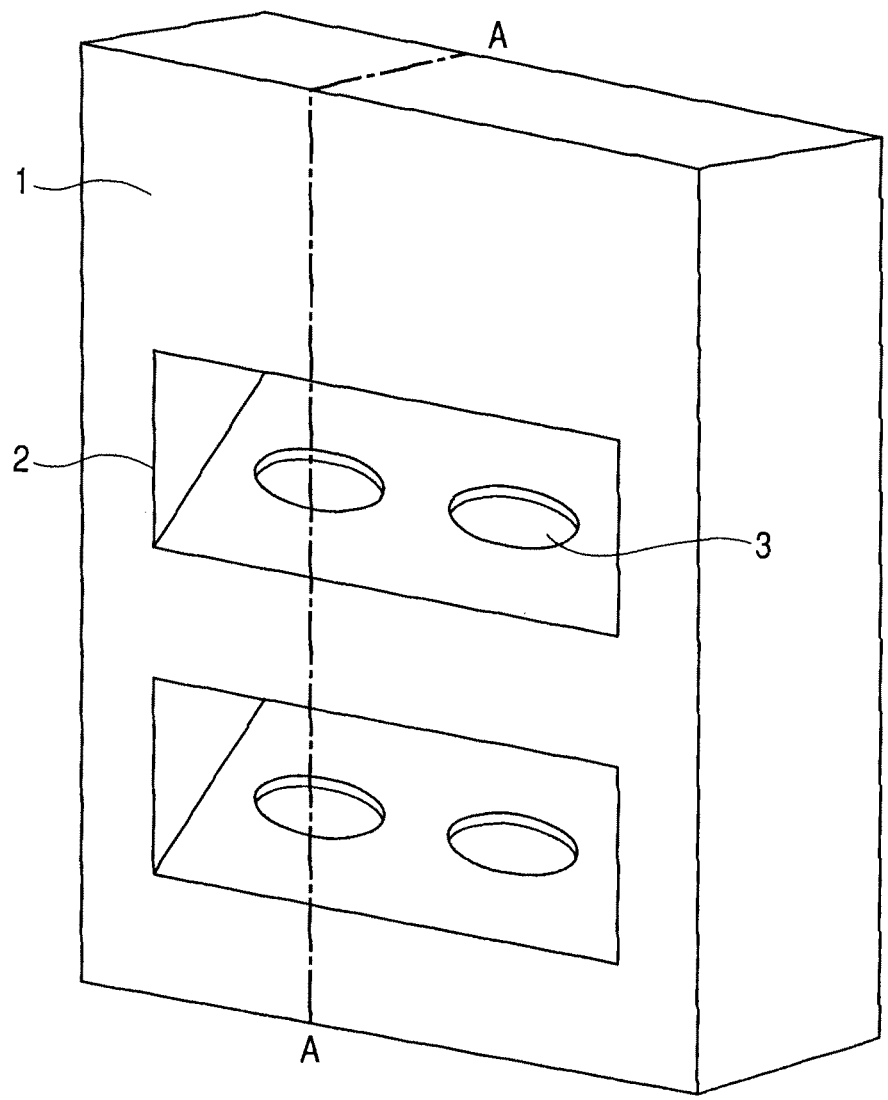
FIG. 1 is a perspective view of silencing equipment for electronic devices, according to the first embodiment of the present invention.

FIG. 1 is a perspective view of silencing equipment for electric devices, according to the first embodiment of the present invention.

Figure 2:
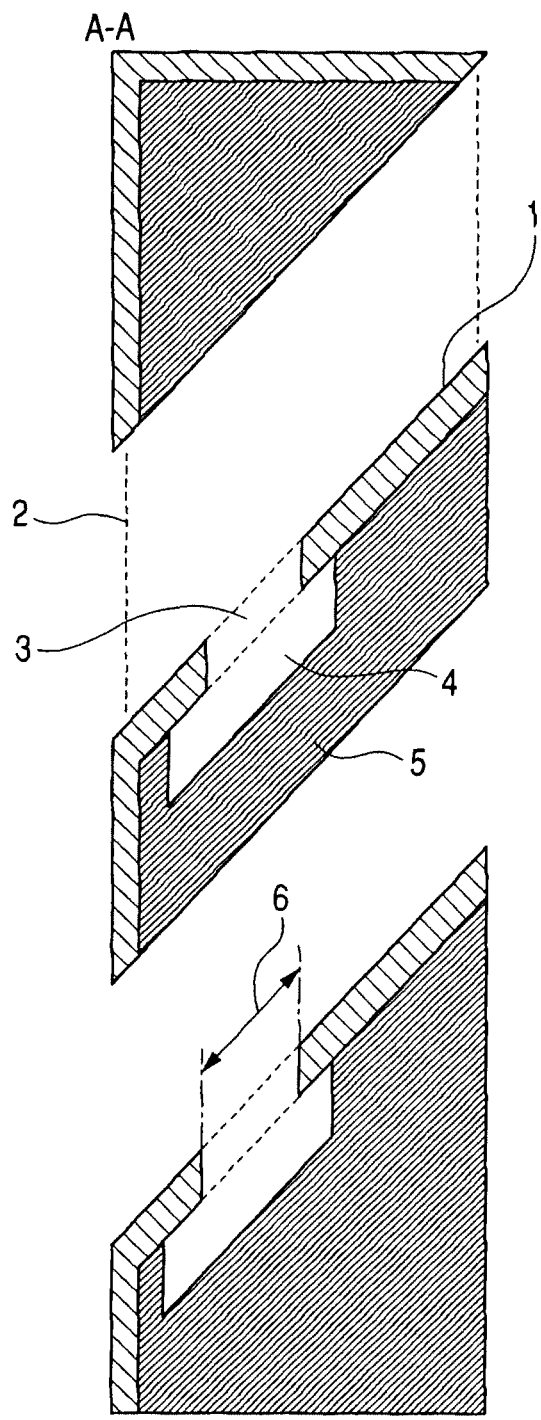
FIG. 2 is a cross sectional view of the silencing equipment for electronic devices, according to the first embodiment of the present invention.

FIG. 2 is a cross sectional view of the silencing equipment for electric devices, according to the first embodiment of the present invention.

Figure 3:
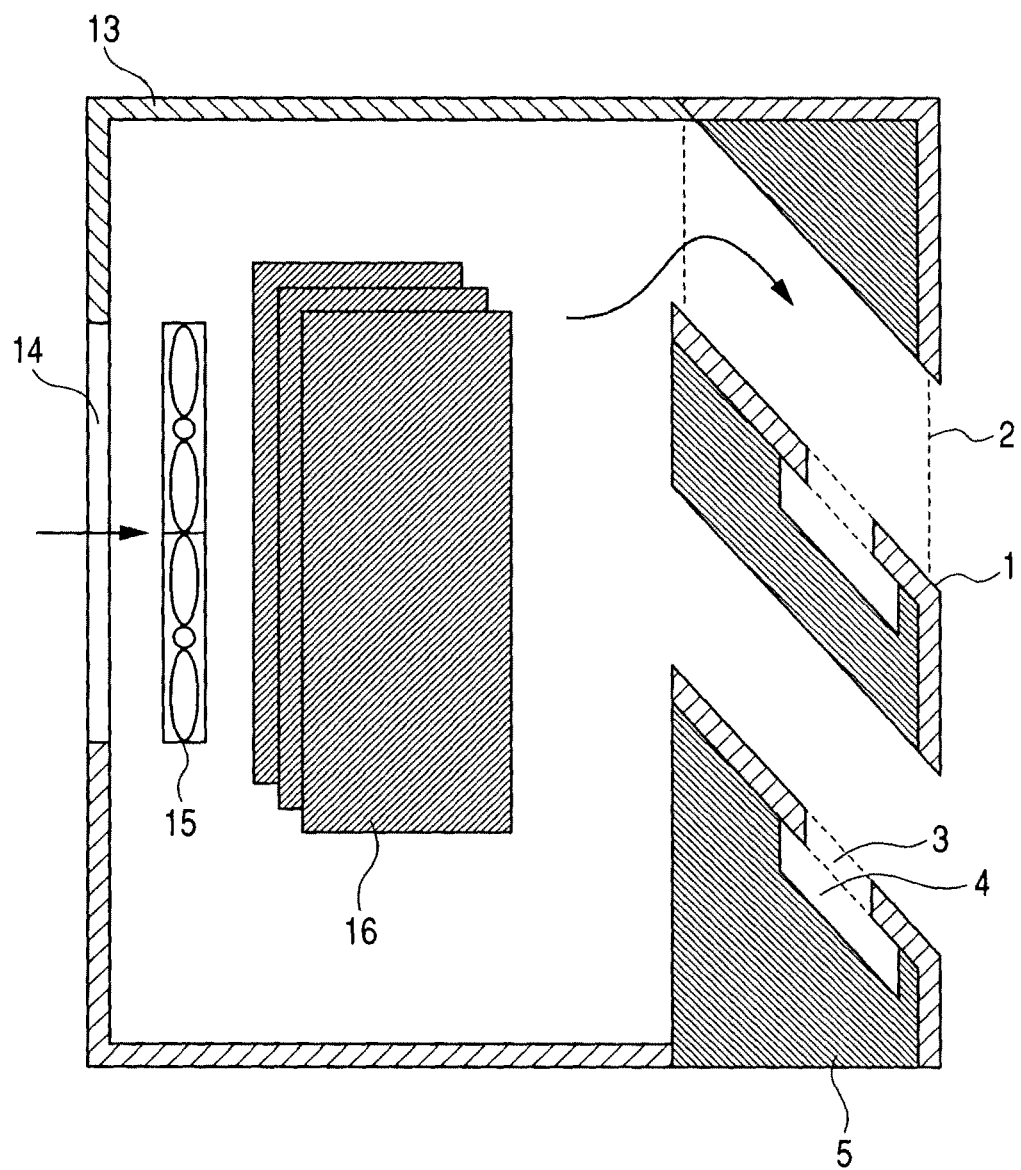
FIG. 3 is a cross sectional view of the silencing equipment, according to the first embodiment of the present invention, which is installed to an electronic device.

FIG. 3 is a cross sectional view of the silencing equipment installed to an electronic device, according to the first embodiment of the present invention.

Figure 19:
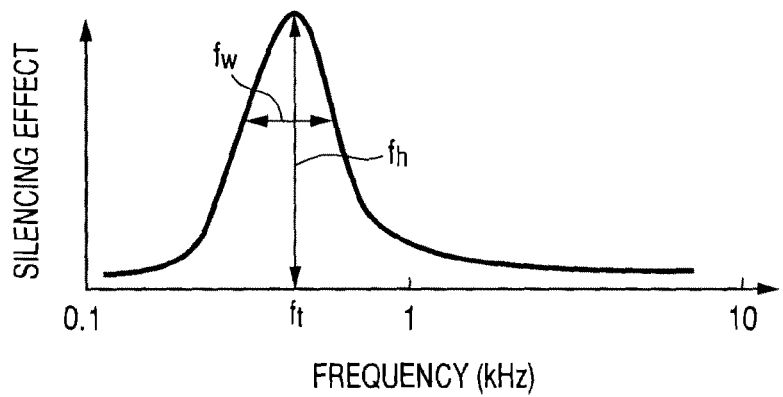
FIG. 19 is a graph showing the relationship between a frequency of a resonance type silencer and a silencing effect.

FIG. 19 is a graph showing the relationship between a frequency of a resonance type silencer and a silencing effect.

Figure 20:
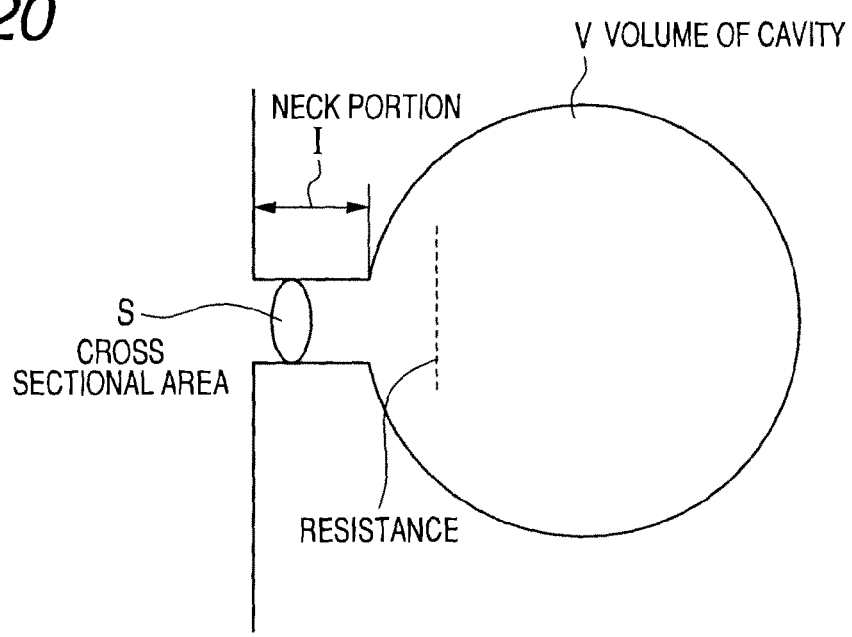
FIG. 20 is a schematic diagram showing the structure of a general Helmholtz resonator.

FIG. 20 is a schematic diagram showing the structure of a general Helmholtz resonator.

The silencing equipment according to the present embodiment can be used as a mechanism for reducing the level of noise at door portions of intake and exhaust ports of an electronic device such as a blade server. As shown in FIG. 1, the silencing equipment according to the present embodiment includes flow channels 2 through which cooling air flows. The flow channels 2 are inclined such that a source of noise cannot be viewed from the front side of the silencing equipment. FIG. 2 is a cross sectional view of the silencing equipment taken along a line A-A of FIG. 1.

The silencing equipment according to the present embodiment further includes a flow channel forming member 1 and an acoustic absorbent member 5. Portions of the flow channel forming member 1 form the flow channels 2. The acoustic absorbent member 5 is fixed to the flow channel forming member 1. The acoustic absorbent member 5 has cavities 4 of resonance type silencers therein. The flow channel forming member 1 has a plurality of holes 3 which form apertures of the resonance type silencers, respectively. Each of the apertures has an area 6. A cross sectional area of at least one part of each of the cavities 4 is larger than a cross sectional area of an interface between the aperture and the cavity 4.

The silencing equipment according to the present embodiment has Helmholtz resonators. Each of the Helmholtz resonator is constituted by the hole 3 and the cavity 4.

Each of the Helmholtz resonators has a structure shown in FIG. 20 and is an urceolate cavity in which a neck portion and a cavity portion are in series. When an acoustic wave corresponding to a resonant frequency f enters the cavity (Helmholtz resonator), a resonance occurs to vibrate air present in the neck portion significantly. In this case, although sound is reradiated from the neck portion, viscous resistance acts at a tube wall of the resonator. Part of energy of the sound wave present in the cavity (Helmholtz resonator) is then exchanged to heat. Thus, an acoustic absorption effect occurs. The resonant frequency f is represented by formula 1.

$$f = \frac{c}{2\pi}\sqrt{\frac{S}{(l+\delta)V}} \quad \text{formula 1}$$

where c is an acoustic velocity, and δ is a correction (open-end correction) of the length of the neck portion. When the diameter of the neck portion is represented by d, δ=0.8d.

The silencing equipment according to the present embodiment provides a silencing effect (shown in FIG. 18) on a wide frequency band by means of the acoustic absorbent member. In addition, the silencing equipment provides another silencing effect (shown in FIG. 19) on a specified (target) frequency $f_t$ by means of the resonance type silencer. The target frequency $f_t$ is determined by the volume of the cavity 4 and the area 6 of the aperture. Therefore, the resonance type silencer having maximal silencing effect on the peak frequency of the target noise can be obtained, by designing the volume of the cavity 4 and the area 6 of the aperture such that a peak frequency of target noise matches the target frequency $f_t$ of the resonance type silencer. Thus, the silencing effect can be improved without an increase in the thickness, area and the like of the acoustic absorbent member. In addition, a silencing structure of the silencing equipment can be downsized.

The silencing equipment according to the present embodiment includes the resonance type silencers provided in parts of the flow channel forming member 1 that forms the flow channels through which cooling air flows. Thus, the silencing equipment according to the present embodiment has both a ventilation property and a silencing property. The silencing property can be improved while the cooling air is not prevented from passing through the flow channels.

The silencing equipment according to the present embodiment has the two flow channels 2 through which cooling air flows. The silencing equipment according to the present embodiment, however, may have one flow channel or three or more flow channels. Although the hole 3 forming the aperture of the resonance type silencer is circular, it may be rectangular or have another shape. The number of the holes 3 may be one or more. The acoustic absorbent member 5 having therein the cavities 4 of the resonance type silencers may be made of any material as long as the cavities 4 of the resonance type silencers can be formed. Although each of the flow channels 2 through which cooling air flows is linear it may have any shape as long as a source of noise cannot be viewed from the front side.

FIG. 3 shows the silencing equipment (shown in FIG. 2) that is installed to a chassis 13 of an electronic device such as a blade server. The electronic device used in the present embodiment includes a fan 15 and a plurality of servers 16 each of which has a heat generating section such as a CPU. Cooling air enters the electronic device through an intake port 14 and flows out of the electronic device through the flow channels 2. The silencing equipment according to the present embodiment, installed on the side from which the cooling air is discharged provides a silencing effect on a wide frequency band by means of the acoustic absorbent member 5, in addition to a silencing effect on a peak frequency of noise generated by the fan 15 by means of the resonance type silencer.

Figure 16:
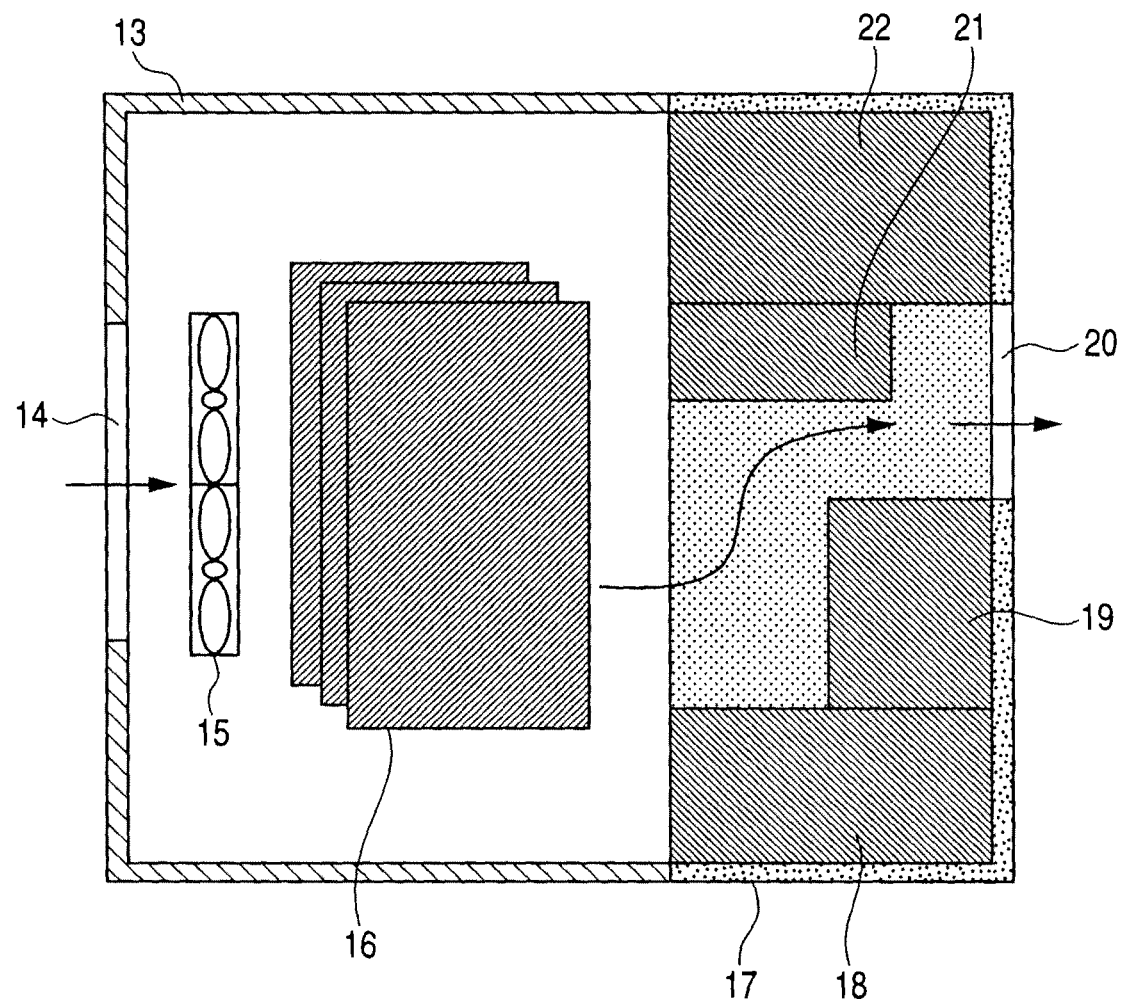
FIG. 16 is a cross sectional view of conventional silencing equipment for electronic devices.
Figure 17:
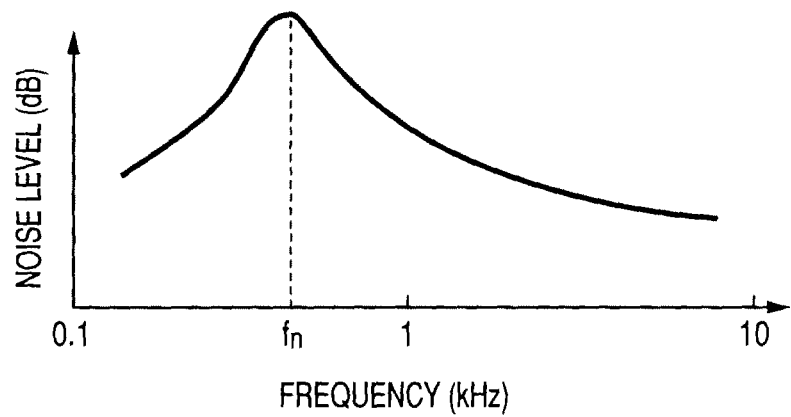
FIG. 17 is a graph showing the relationship between a frequency of noise generated by a fan and the noise level.
Figure 18:
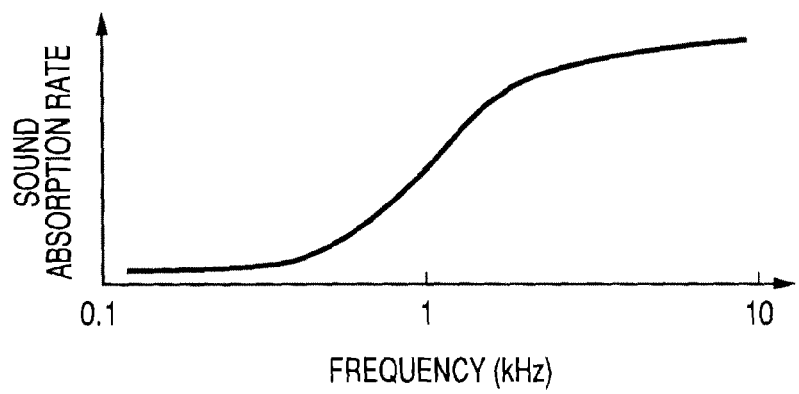
FIG. 18 is a graph showing the relationship between a frequency of noise absorbed by a general acoustic absorbent material and the sound absorption rate.

Thus, the silencing equipment according to the present embodiment provides a higher silencing effect than that provided only by a plurality of acoustic absorbent members 18, 19, 21 22 of conventional silence equipment shown in FIG. 16. As a result, a silencing structure of the silencing equipment according to the present embodiment can be downsized.

In the structure (shown in FIG. 3) according to the present embodiment, the silencing equipment is placed on the side from which the cooling air is discharged outside the electronic device. The silencing equipment may be placed on the side from which the cooling air enters inside the electronic device.

Second Embodiment

The second embodiment of the present invention is described below with reference to FIGS. 4 to 6.

Figure 4:
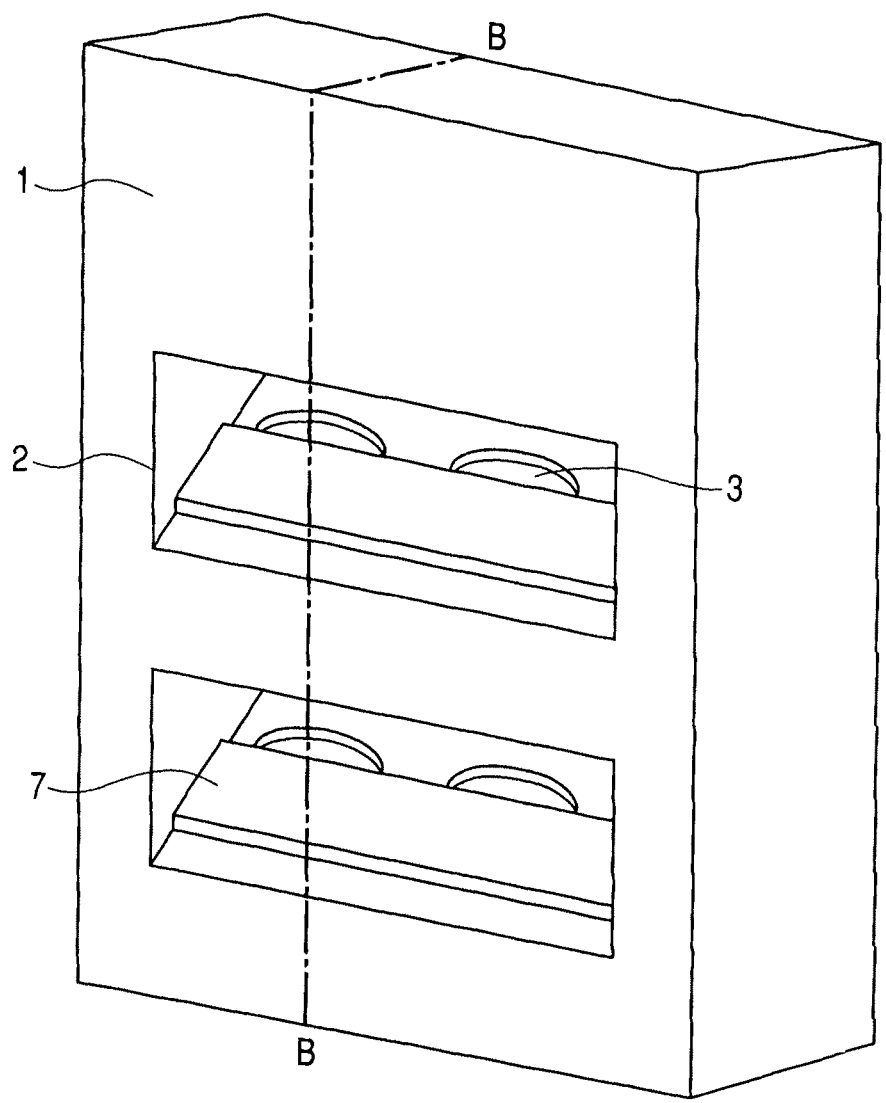
FIG. 4 is a perspective view of silencing equipment for electronic devices, according to the second embodiment of the present invention.

FIG. 4 is a perspective view of silencing equipment for electronic devices, according to the second embodiment of the present invention.

Figure 5:
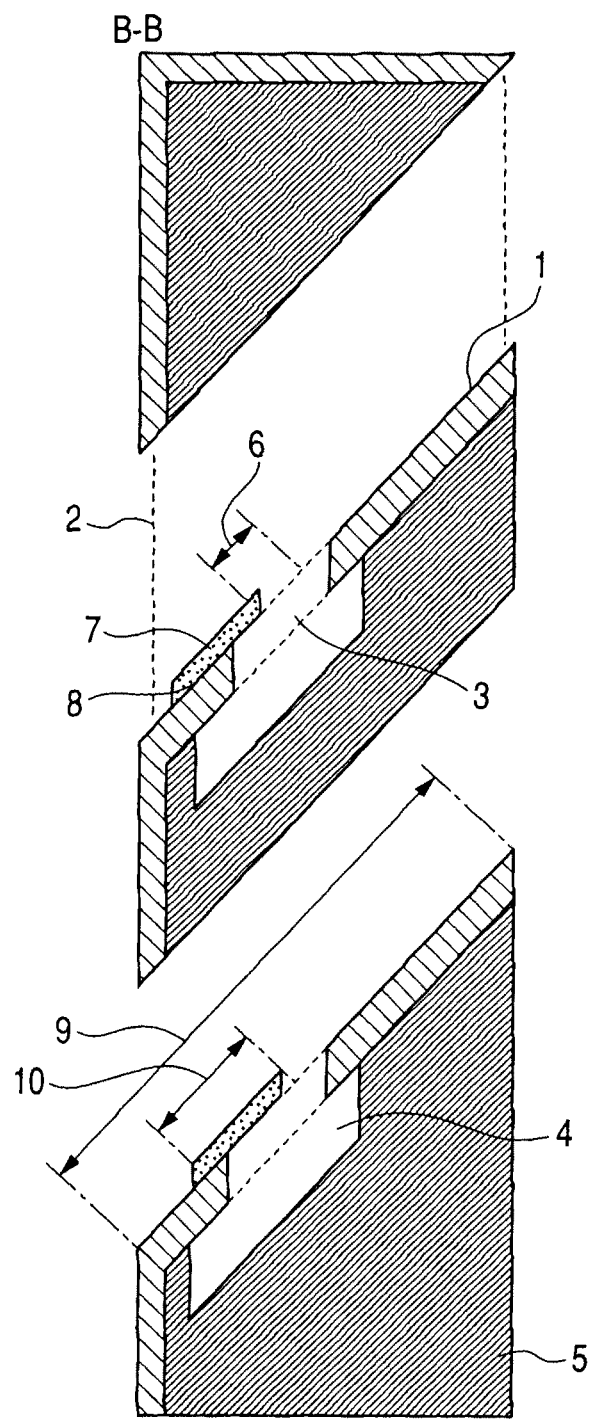
FIG. 5 is a cross sectional view of the silencing equipment for electronic devices, according to the second embodiment of the present invention.

FIG. 5 is a cross sectional view of the silencing equipment for electronic devices, according to the second embodiment of the present invention.

Figure 6:
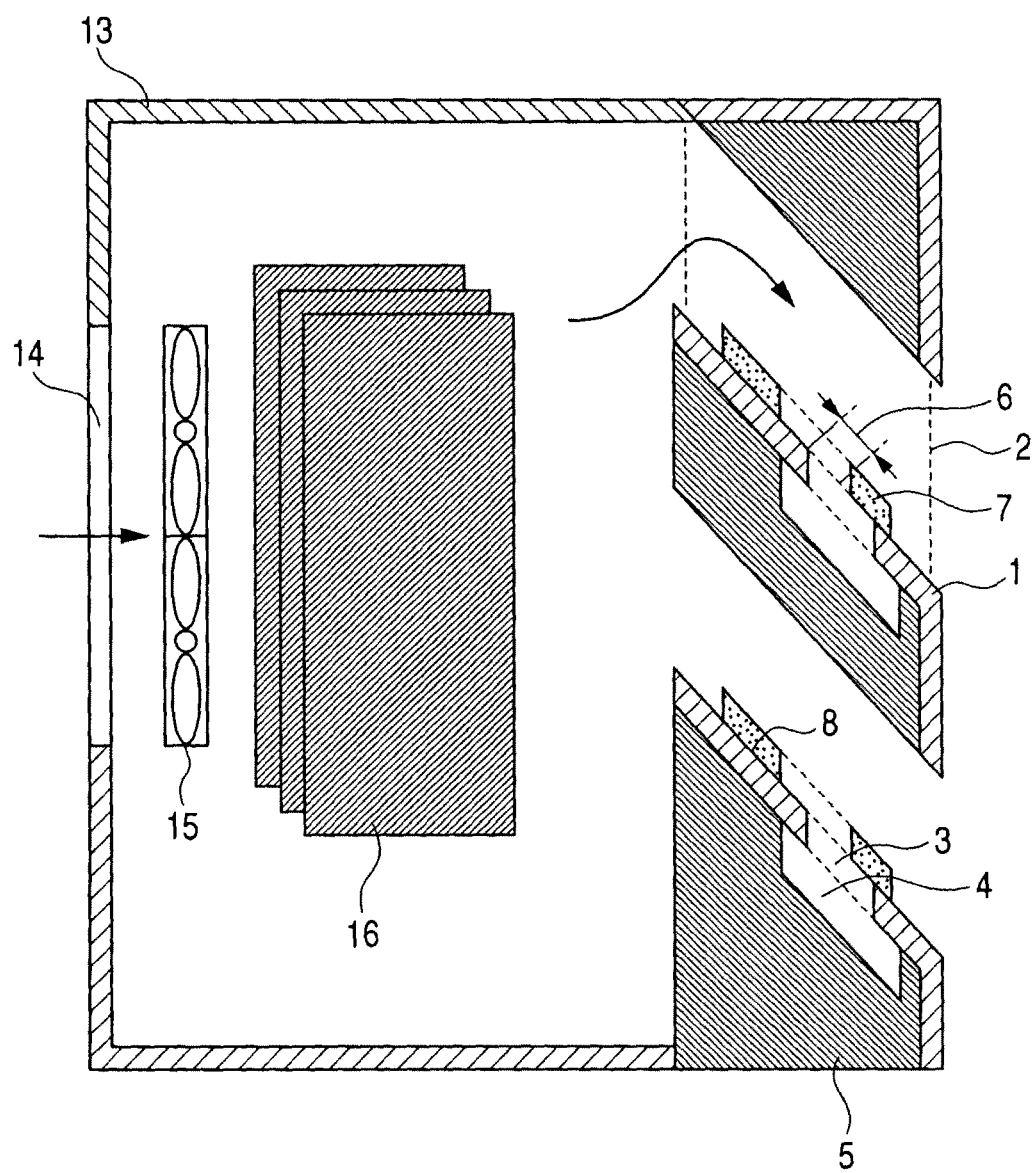
FIG. 6 is a cross sectional view of the silencing equipment for electronic devices, according to the second embodiment of the present invention, the silencing equipment being installed to an electronic device.

FIG. 6 is a cross sectional view of the silencing equipment for electronic devices, according to the second embodiment of the present invention, the silencing equipment being installed to an electronic device.

FIG. 5 is the cross sectional view taken along a line B-B of FIG. 4.

Basic members of the silencing equipment according to the second embodiment are the same as those of the silencing equipment according to the first embodiment. The second embodiment is different from the first embodiment in that the former includes a slide member 7. The slide member 7 slides by a slide mechanism 8 to adjust the area 6 of the aperture of the resonance type silencer. The volume of the cavity 4 and the area 6 of the aperture determines a target frequency of the resonance type silencer. When a peak frequency of target noise changes, the slide mechanism 8 slides the slide member 7 to adjust the area 6 of the aperture and thereby change the target frequency of the resonance type silencer. Thus, the resonance type silencer can maximize the silencing effect.

As the slide member 7 has a length 10 that is shorter than the length 9 (shown in FIG. 5) of the flow channel forming member 1, a movement range of the slide member 7 by means of the slide mechanism 8 is within the length 9 of the flow channel forming member 1. This configuration allows the target frequency of the resonance type silencer to change without changing the size of the silencing structure.

The silencing equipment according to the present invention adjusts the target frequency of the resonance type silencer to a peak frequency of noise generated by the fan even when frequency characteristics of the fan change due to a change in specifications of the electronic device or a change in an operating condition of the electronic device or the like. Thus, the silencing equipment according to the present invention maximizes the silencing effect. Therefore, it is not necessary to reconfigure the silencing structure based on an electronic device designed according to a different specification(s) or an electronic device that will be in a different operating state.

In the silencing equipment according to the present embodiment, detecting the peak frequency of noise and setting the area of the aperture of the resonance type silencer may be manually or automatically performed. For example, a microphone may be set in the flow channel 2 for the cooling air to detect a peak frequency of noise generated by the fan under the condition that the electronic device is in an operating state, and the slide mechanism 8 which is automated automatically sets the area 6 of the aperture. In this way, the silencing structure allows the target frequency of the resonance type silencer to automatically change on the basis of a change in the peak frequency of the noise.

FIG. 6 shows the state in which the silencing equipment shown in FIG. 5 is installed to the chassis 13 of the electronic device such as a blade server. The electronic device includes a fan 15 and a plurality of servers 16 each of which has a heat generating section such as a CPU. Cooling air enters the electronic device through the intake port 14 and flows out of the electronic device through the flow channels 2 in the same manner as the first embodiment.

With electronic device such as a blade server including attachable/removable servers, frequency characteristics of noise generated by the fan may change due to a change in specifications or a change in an operating condition of the electronic device. In this case, the target frequency of the resonance type silencer can be changed by means of the slide mechanism 8 without a change in the size of the silencing structure in the present embodiment. In other words, the slide mechanism 8 changes the area 6 of the aperture to adjust the target frequency of the resonance type silencer to the peak frequency of the noise generated by the fan even when the frequency characteristics of the noise generated by the fan change due to a change in the number of the servers 16 or a change in the operating condition of the electronic device. Thus, the silencing structure can be optimally configured. In addition, it is not necessary to reconfigure the silencing structure in response to a change in the specifications or operating condition of the electronic device, e.g., due to a change in the number of the servers 16 or a change in the number of fans 15.

Third Embodiment

The third embodiment of the present invention is described below with reference to FIGS. 7 and 8.

Figure 7:
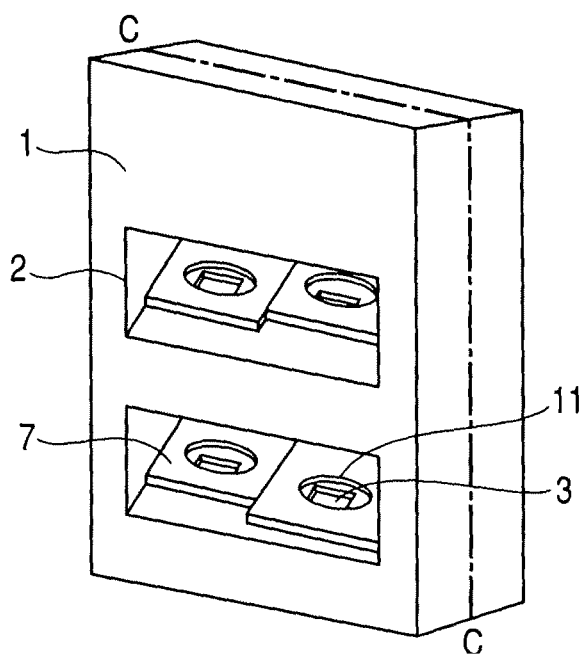
FIG. 7 is a perspective view of silencing equipment for electronic devices, according to the third embodiment of the present invention.

FIG. 7 is a perspective view of silencing equipment for electronic devices according to the third embodiment of the present invention.

Figure 8:
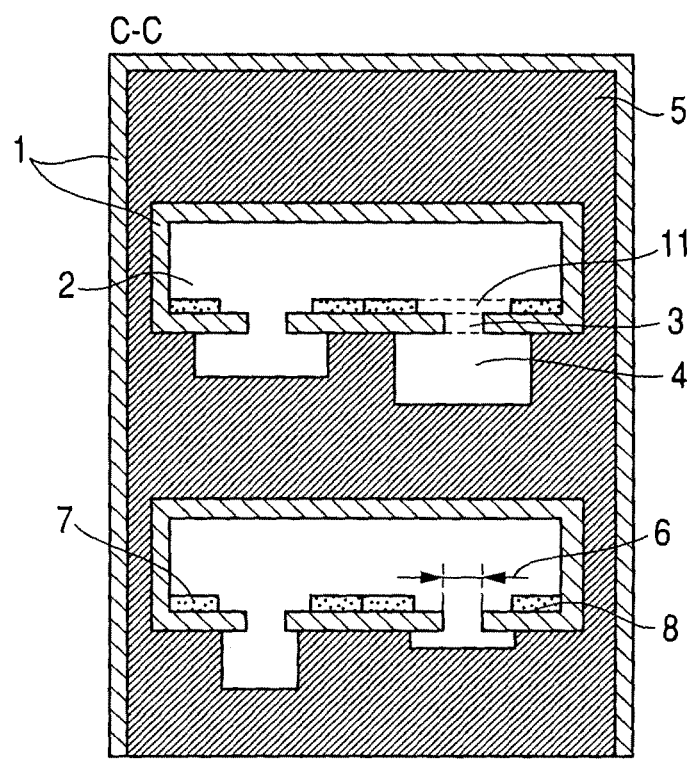
FIG. 8 is a cross sectional view of the silencing equipment for electronic devices, according to the third embodiment of the present invention.

FIG. 8 is a cross sectional view of the silencing equipment for electronic devices according to the third embodiment of the present invention.

FIG. 8 shows the cross section of the silencing equipment taken along line C-C of FIG. 5.

Basic members of the silencing equipment according to the third embodiment are the same as those of the silencing equipment according to the second embodiment. As with the second embodiment, the silencing equipment according to the third embodiment includes the slide member 7 capable of adjusting the area 6 of the aperture of the resonance type silencer by means of the slide mechanism 8. The third embodiment is different from the second embodiment in that the slide member 7 according to the third embodiment is divided into a plurality of slide portions each of which independently slides and in the configuration of the aperture of each resonance type silencer. A plurality of cavities 4 of the resonance type silencers is provided in the acoustic absorbent member 5. The apertures having the areas 6 include respective holes 11 and respective holes 3. The holes 11 are provided in the respective slide members 7, while the holes 3 are provided in the flow channel forming member 1. Since the areas 6 of the apertures can be adjusted by means of the slide mechanism 8, the target frequency of each of the resonance type silencers provided in the silencing structure can be independently set.

With this embodiment described above, even when target noise has a plurality of peak frequencies and the peak frequencies change, the silencing equipment matches the target frequencies of the resonance type silencers with the peak frequencies to allow the resonance type silencers to maximize the silencing effects on the plurality of peak frequencies.

Fourth Embodiment

The fourth embodiment of the present invention is described below with reference to FIG. 9.

Figure 9:
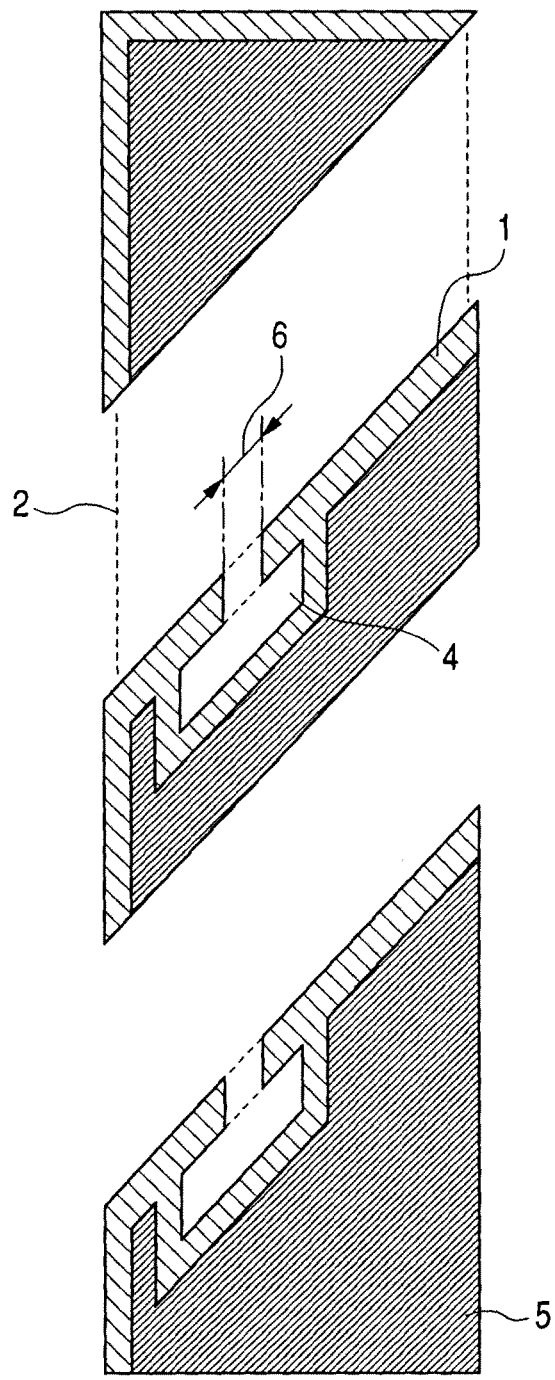
FIG. 9 is a cross sectional view of silencing equipment for electronic devices, according to the fourth embodiment of the present invention.

FIG. 9 is a cross sectional view of silencing equipment for electronic devices, according to the fourth embodiment of the present invention.

Basic members of the silencing equipment according to the fourth embodiment are the same as those of the silencing equipment according to the first embodiment. The fourth embodiment is different from the first embodiment in structural method of cavities 4 and apertures of the resonance type silencers. The cavities 4 and apertures of the resonance type silencers are formed by bending the flow channel forming member 1. When each of the resonance type silencers is formed by wall surfaces made of rigid members, a frequency range $f_w$ including a target frequency $f_t$ shown in FIG. 19 is small, and the silencing effect $f_h$ is large. The flow channel forming member 1 is typically made of a more rigid material than the acoustic absorbent member 5. Thus, the resonance type silencers of the silencing equipment according to the fourth embodiment can reduce the level of target-frequency noise more compared with that according to the first embodiment. Therefore, an effective silencing structure can be constructed even when target noise has a significantly intense peak frequency.

Fifth Embodiment

The fifth embodiment of the present invention is described below with reference to FIG. 10.

Figure 10:
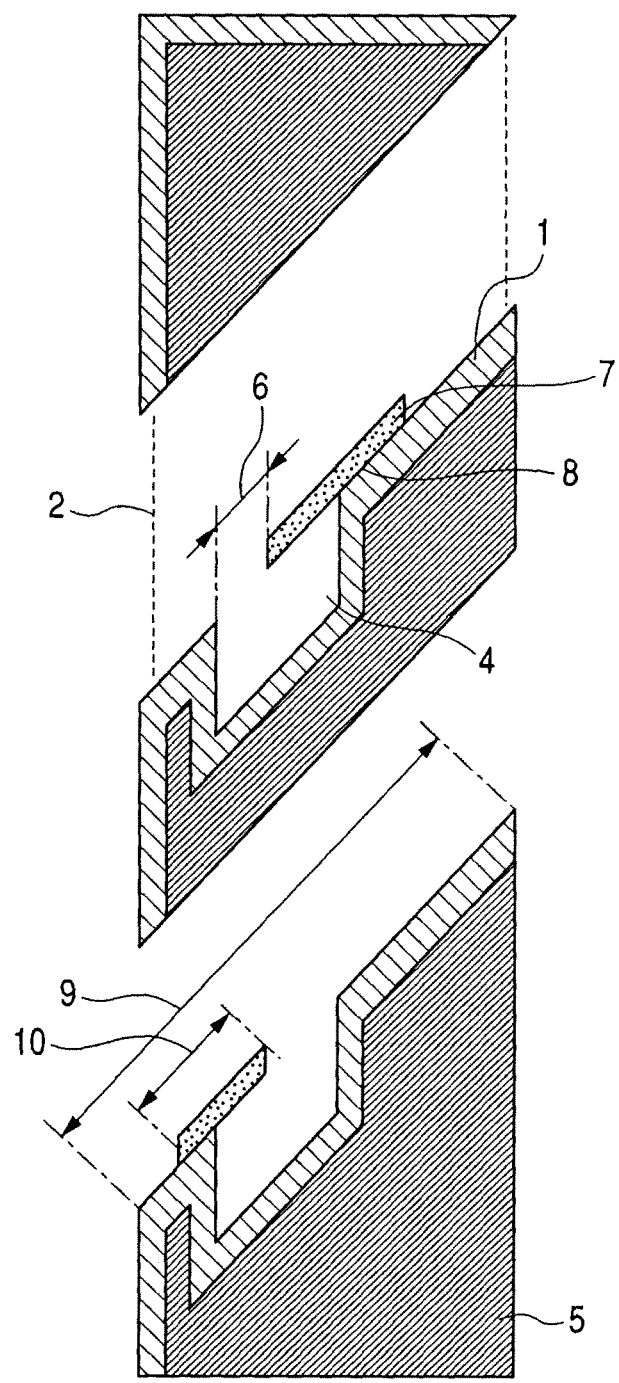
FIG. 10 is a cross sectional view of silencing equipment for electronic devices, according to the fifth embodiment of the present invention.

FIG. 10 is a cross sectional view of silencing equipment for electronic devices, according to the fifth embodiment of the present invention.

As with the fourth embodiment, the cavities 4 and apertures of the resonance type silencers according to the fifth embodiment are formed by bending the flow channel forming member 1. However, these two embodiments are different in that the silencing equipment according to the fifth embodiment includes the slide members 7 capable of adjusting the areas 6 of the apertures of the resonance type silencers by means of the slide mechanism 8.

Therefore, the slide mechanism 8 changes the areas 6 of the apertures to adjust target frequencies of the resonance type silencers and thereby optimizes the resonance type silencers even when target noise has a significantly intense peak frequency (or frequencies) and the peak frequency (or frequencies) changes due to a change in an operating state of the electronic device.

As shown in the cross sectional view of FIG. 10, the slide members may be provided on both upper and lower top sides of each of the apertures.

Sixth Embodiment

The sixth embodiment of the present invention is described below with reference to FIGS. 11 and 12.

Figure 11:
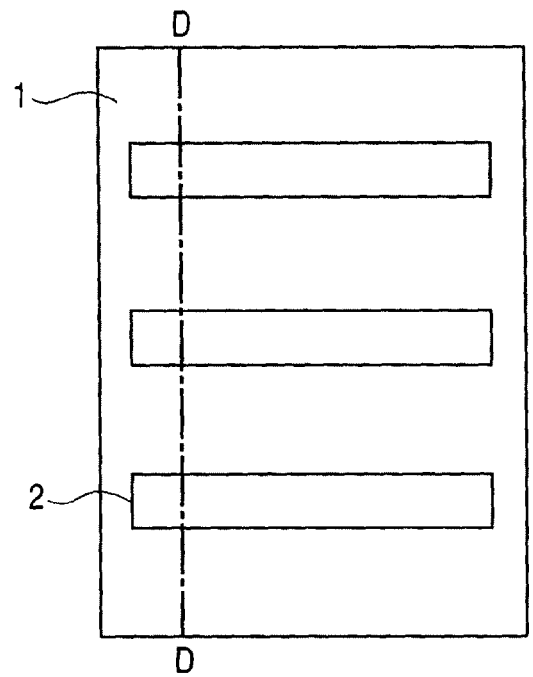
FIG. 11 is a front view of silencing equipment for electronic devices, according to the sixth embodiment of the present invention.

FIG. 11 is a front view of silencing equipment for electronic devices, according to the sixth embodiment of the present invention.

Figure 12:
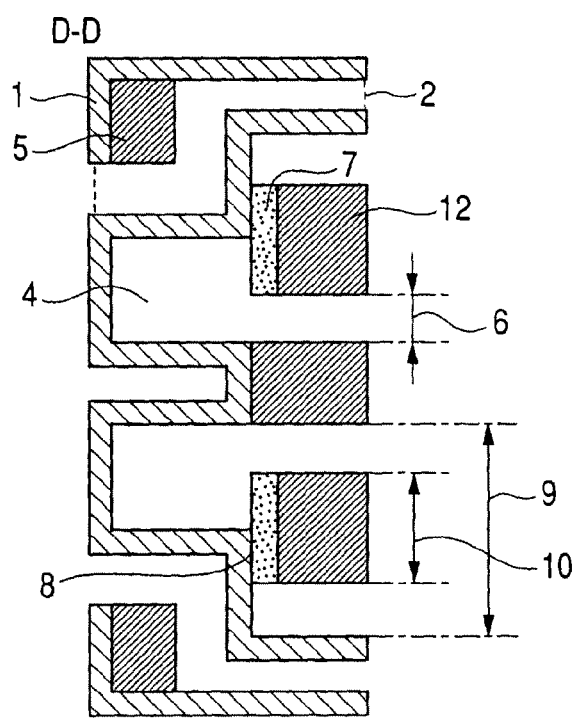
FIG. 12 is a cross sectional view of the silencing equipment for electronic devices, according to the sixth embodiment of the present invention.

FIG. 12 is a cross sectional view of the silencing equipment for electronic devices according to the sixth embodiment of the present invention, taken along line D-D of FIG. 11.

Basic structure of the silencing equipment according to the sixth embodiment is the same as that of the silencing equipment according to the fifth embodiment. However, these two embodiments are different in that acoustic absorbent members 12 are fixed to the respective slide members 7 in the sixth embodiment. The acoustic absorbent members 12 fixed to the slide members 7 improve silencing effects compared with the case where the acoustic absorbent members 12 are not fixed to the slide members 7.

Seventh Embodiment

The seventh embodiment of the present invention is described below with reference to FIG. 13.

Figure 13:
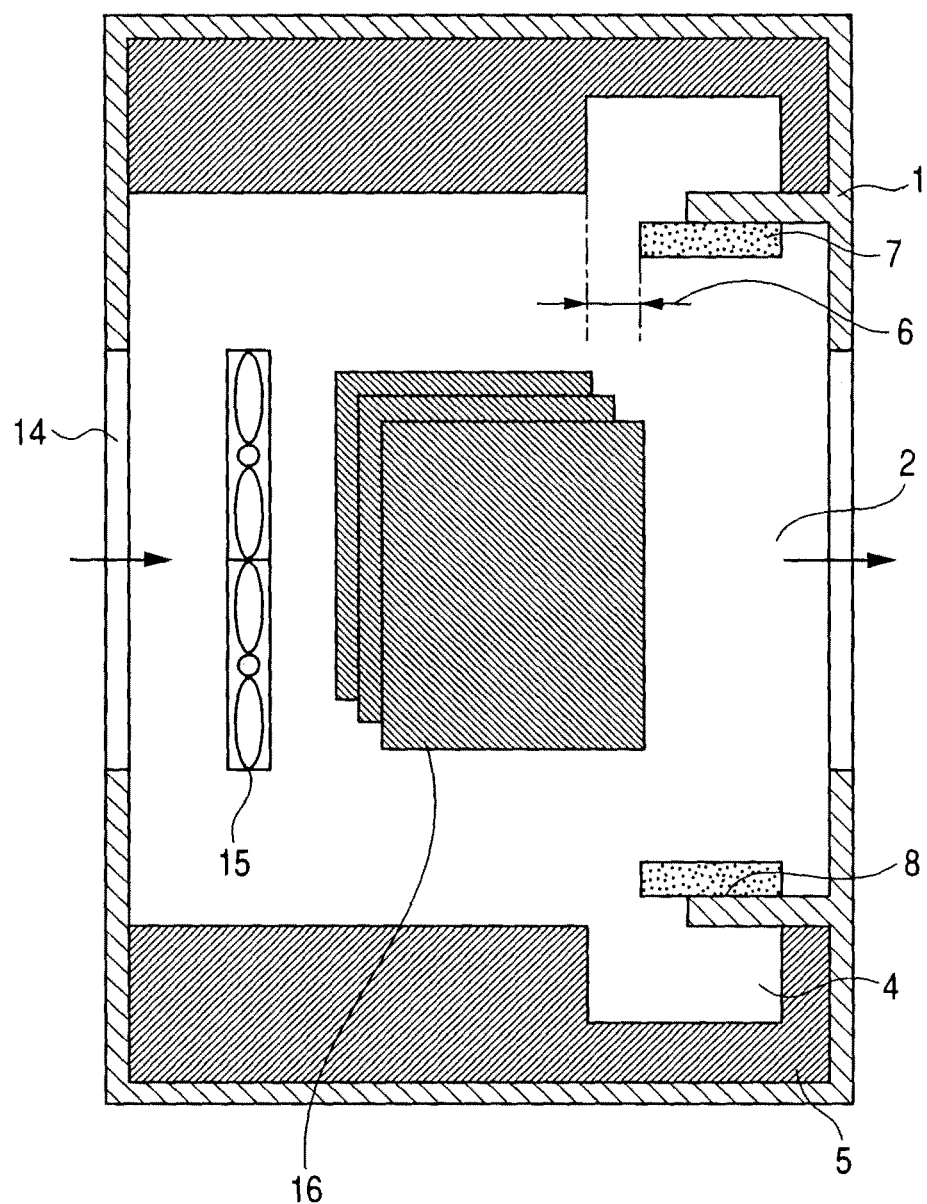
FIG. 13 is a cross sectional view of silencing equipment for electronic devices, according to the seventh embodiment of the present invention.

FIG. 13 is across sectional view of an electronic device according to the seventh embodiment of the present invention.

The electronic device shown in FIG. 13 is a blade server or the like and includes a resonance type silencer in a chassis thereof. The electronic device has a fan 15, servers 16 having heat generating sections such as CPUs, and the like. The fan 15, the servers 16 and the like are located in a silencing structure of the electronic device. Cooling air enters the electronic device through an intake port 14 and flows out of the chassis through a flow channel 2 of the electronic device. The silencing structure has both a ventilation property and a silencing property.

Any of the silencing equipment described in the first to sixth embodiments may be placed on the cooling air intake side or cooling air discharge side of the electronic device (shown in FIG. 13) according to the seventh embodiment to provide the silencing effect.

Eighth Embodiment

The eight embodiment of the present invention is described below with reference to FIG. 14.

Figure 14:
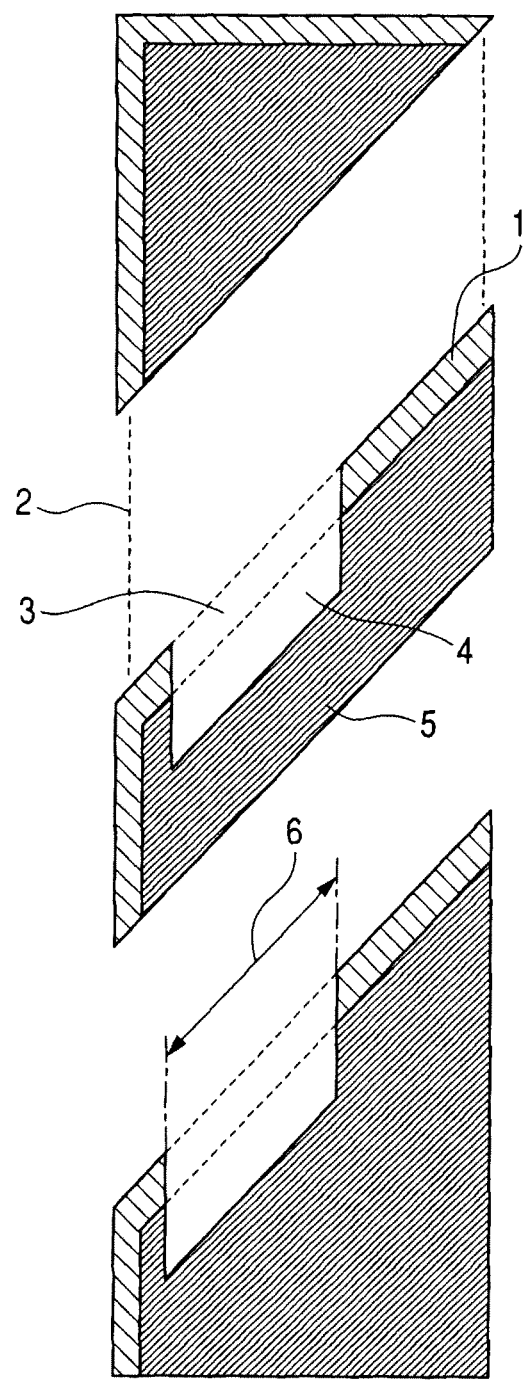
FIG. 14 is a cross sectional view of silencing equipment for electronic devices, according to the eighth embodiment of the present invention.

FIG. 14 is a cross sectional view of silencing equipment for electronic devices according to the eight embodiment of the present invention.

As with the first embodiment, the silencing equipment according to the present embodiment includes the flow channel forming member 1 portions of which form the flow channels 2, and the acoustic absorbent member 5 fixed to the flow channel forming member 1, and the silencing equipment of the present embodiment is installed to an electronic device. However, these two embodiments are different in structure of the cavities 4 and apertures of the resonance type silencers. In the present embodiment, the area 6 of each of the apertures is the same as that of the top of the cavity 4 located under the aperture. That is, the shapes of the top and bottom of each of the apertures are the same as that of the top of the cavity 4 located under the aperture. The thus configured cavities 4 allow the cooling air to flow in a wide region. The flow channel forming member 1 and the acoustic absorbent member 5 form an expansion type silencer.

The expansion type silencer is a reactive type silencer. That is, the expansion type silencer rapidly changes its duct cross sectional area to form a discontinuous portion of acoustic impedance. The expansion type silencer then reduces propagating sound by means of reflection that occurs at the location at which the duct cross sectional area rapidly changes. Since the expansion type silencer provides the sound reduction effect, the silencing equipment can cover a relatively wide frequency range (or can reduce the level of noise of the relatively wide frequency range).

Ninth Embodiment

The ninth embodiment of the present invention is described below with reference to FIG. 15.

Figure 15:
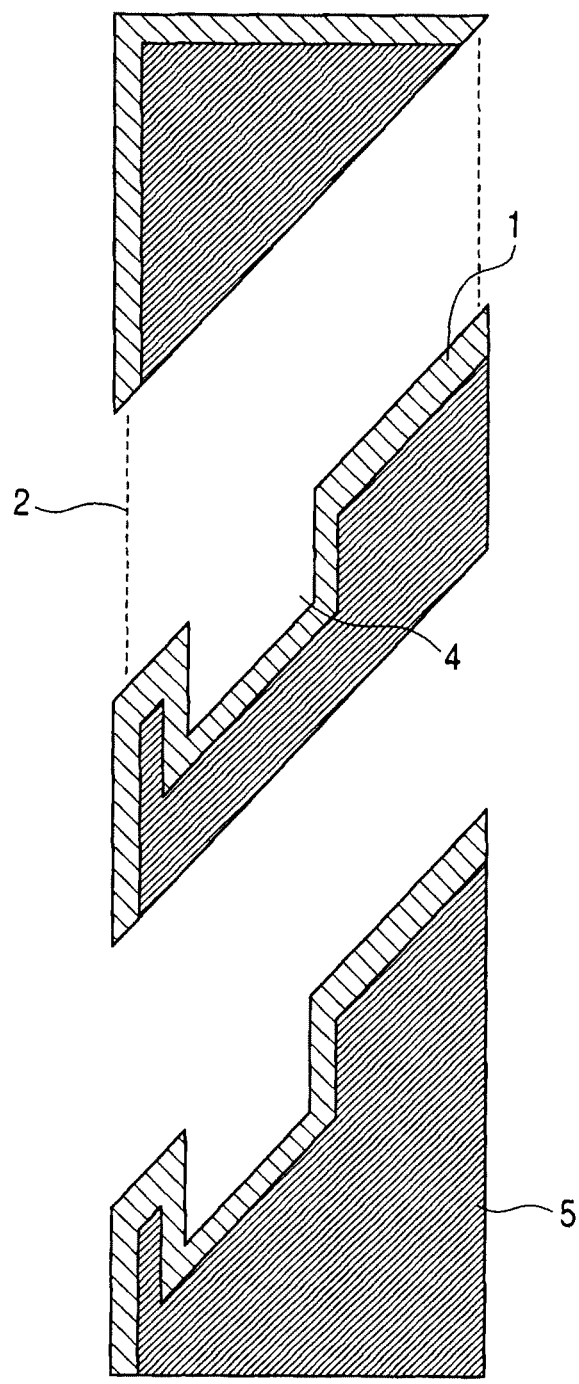
FIG. 15 is a cross sectional view of silencing equipment for electronic devices, according to the ninth embodiment of the present invention.

FIG. 15 is a cross sectional view of an electronic device according to the ninth embodiment of the present invention.

As with the eighth embodiment, silencing equipment according to the ninth embodiment includes the expansion type silencer. However, these two embodiments are different in structural method of the cavities 4 and the apertures of the expansion type silencer. The cavities 4 and apertures of the expansion type silencers according to the embodiment are formed by bending the flow channel forming member 1.

The invention claimed is:

1. Silencing equipment for electronic devices, the silencing equipment being adapted to be installed to an electronic device having a fan that blows cooling air to cool a heat generating section, the silencing equipment comprising:
a flow channel forming member that forms a flow channel through which the cooling air flows, wherein an aperture is provided in a portion of the flow channel forming member;
a cavity communicating with the aperture and formed by bending the flow channel forming member;
a slide member configured to slide via a slide mechanism, wherein the slide member is provided on top of the aperture to adjust an area of the top of the aperture; and
acoustic absorbent members, wherein the acoustic absorbent members are attached to the flow channel forming member and the slide member,
wherein the aperture and the cavity form a resonance type silencer on a wall surface of the flow channel by making a cross sectional area of at least one part of the cavity larger than that of an interface between the aperture and the cavity.

2. The silencing equipment according to claim 1, wherein the slide member includes a plurality of holes formed thereon.

3. The silencing equipment according to claim 1, wherein the flow channel forming member is made of a more rigid material than the acoustic absorbing member.

* * * * *